US008406028B1

(12) United States Patent
Lin et al.

(10) Patent No.: US 8,406,028 B1
(45) Date of Patent: Mar. 26, 2013

(54) WORD LINE LAYOUT FOR SEMICONDUCTOR MEMORY

(75) Inventors: Tzu-Kuei Lin, Chu-Pai (TW); Hung-Jen Liao, Hsin-Chu (TW); Yen-Huei Chen, Jhudong Township, Hsinchu County (TW); Ping-Wei Wang, Hsin-Chu (TW); Huai-Ying Huang, Jhonghe (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/285,212

(22) Filed: Oct. 31, 2011

(51) Int. Cl.
*G11C 5/06* (2006.01)
*H01L 21/66* (2006.01)

(52) U.S. Cl. .................. 365/63; 365/154; 257/E23.021

(58) Field of Classification Search .......... None
See application file for complete search history.

(56) References Cited

U.S. PATENT DOCUMENTS

| | | | |
|---|---|---|---|
| 5,955,768 | A | 9/1999 | Liaw et al. |
| 5,973,985 | A | 10/1999 | Ferrant |
| 6,370,078 | B1 | 4/2002 | Wik et al. |
| 6,498,758 | B1 | 12/2002 | Pomar et al. |
| 6,665,204 | B2 | 12/2003 | Takeda |
| 6,756,652 | B2 | 6/2004 | Yano et al. |
| 6,822,300 | B2 | 11/2004 | Nii |
| 7,023,056 | B2 | 4/2006 | Liaw |
| 7,319,602 | B1 | 1/2008 | Srinivasan et al. |
| 7,405,994 | B2 | 7/2008 | Liaw |
| 2001/0043487 | A1* | 11/2001 | Nii et al. ................ 365/154 |
| 2003/0048256 | A1 | 3/2003 | Salmon |
| 2004/0120209 | A1 | 6/2004 | Lee et al. |
| 2005/0047256 | A1 | 3/2005 | Yang |
| 2006/0028860 | A1 | 2/2006 | Lien et al. |

OTHER PUBLICATIONS

Nii, K. et al., "A 90 nm Dual-Port SRAM with 2.04 um2 8T-Thin Cell Using Dynamically-Controlled Column Bias Scheme", IEEE International Solid-State Circuits Conference, Session 27, 2004, pp. 27.9.
Wolf, S. Ph.D., "Silicon Processing for the VLSI Era", Process Integration, 1990, (2):160-161.
"Renesas Technology Develops 90 nm Dual-Port SRAM for SoC", DStar, printed on Apr. 6, 2005, 3 pages, World Wide Web, http://www.hpcwire.com/dsstar/04/0224/107497.

* cited by examiner

*Primary Examiner* — Hoai V Ho
*Assistant Examiner* — James G Norman
(74) *Attorney, Agent, or Firm* — Duane Morris LLP

(57) ABSTRACT

A semiconductor memory includes first and second word lines. A first bit cell of a first type is coupled to a first one of a plurality of bit lines and has a first layout in which the first bit cell of the first type is coupled to the first word line with a first number of vias and to the second word line with a second number of vias. A first bit cell of a second type is coupled to a second one of the plurality of bit lines and has a second layout in which the first bit cell of the second type is coupled to the first word line with a third number of vias and to the second word line with a fourth number of vias. A load on the first word line is approximately equal to a load on the second word line.

20 Claims, 5 Drawing Sheets

WORD LINE LAYOUT FOR SEMICONDUCTOR MEMORY

FIELD OF DISCLOSURE

The disclosed system and method relate to semiconductor memories. More specifically, the disclosed system and method relate to word line layouts for semiconductor memories.

BACKGROUND

Static random access memories ("SRAM") include a plurality of cells disposed in rows and columns to form an array. SRAM cells include a plurality of transistors coupled to bit lines and word lines that are used to read and write a bit of data to the memory cell. Dual port SRAMs are a specific type of SRAM that enables multiple reads or writes to occur at approximately the same time. Conventional dual port SRAM structures include word lines in different metal layers, which causes different capacitive loading due to the different metal layers being used to route signals of the SRAM. Such different capacitive loading results in a disparity between operating times of the word lines, which affects the speed of the overall SRAM.

DETAILED DESCRIPTION

The disclosed layout advantageously provides for a symmetric resistance and capacitive ("RC") loading across the word lines ("WL") of a semiconductor memory. The symmetric loading enables semiconductor memory to operate at a faster speed than conventional semiconductor memories with uneven RC loading.

Figure 1:
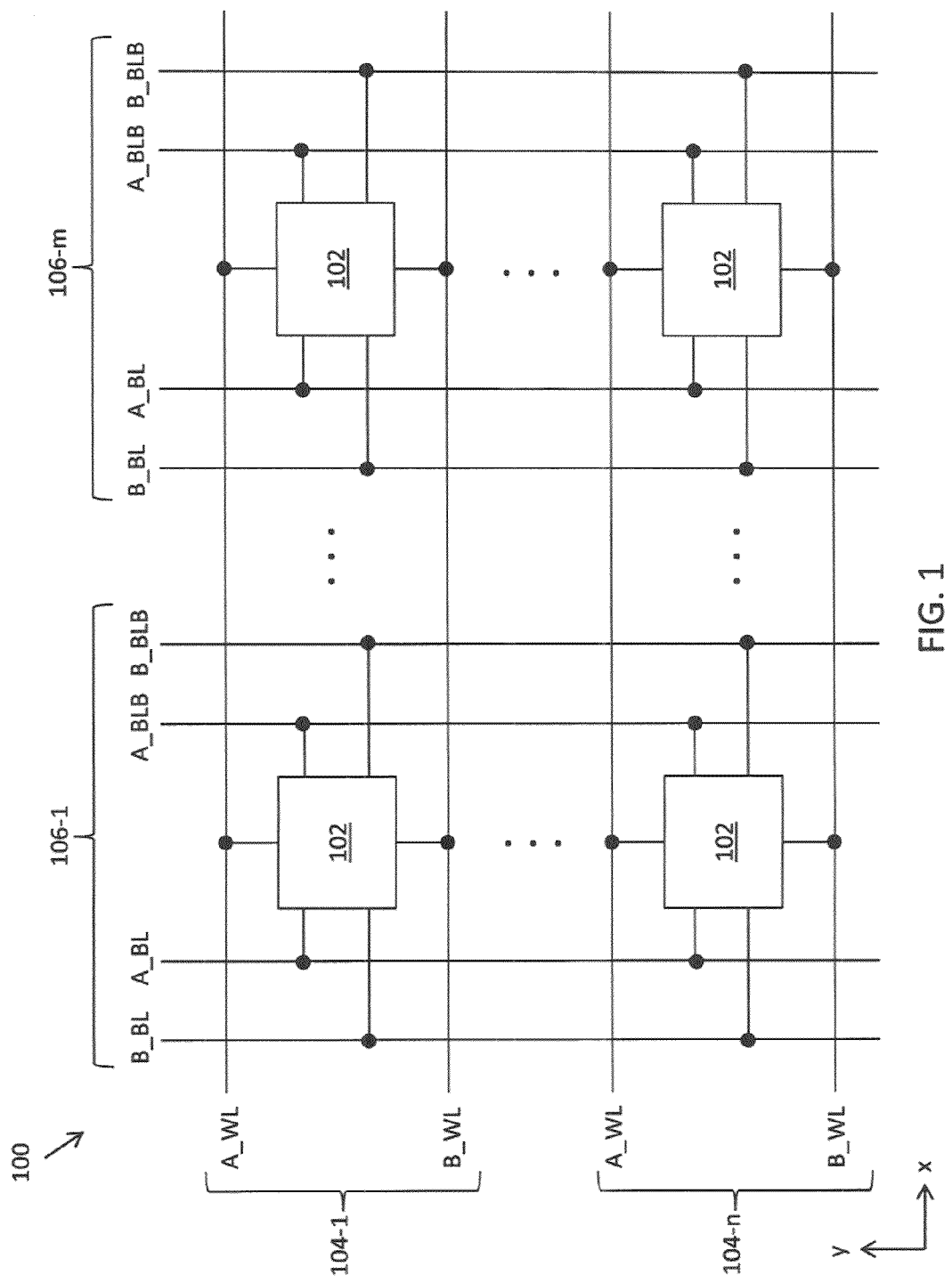
FIG. 1 illustrates one example of a semiconductor memory comprising a plurality of bit cells arranged in rows and columns.

FIG. 1 illustrates one example of a dual port static random access memory ("SRAM") array 100 including a plurality of bit cells 102. Bit cells 102 are arranged in a number, n, of rows 104 and a number, m, of columns 106. Each bit cell 102 is disposed between a pair of word lines, A_WL and B_WL, that extend horizontally across the memory array (i.e., in an x-direction) and a two pairs of complementary bit lines ("BL"), A_BL, B_BL, A_BLB, and B_BLB, that extend vertically across the memory array (i.e., in a y-direction).

Figure 2:
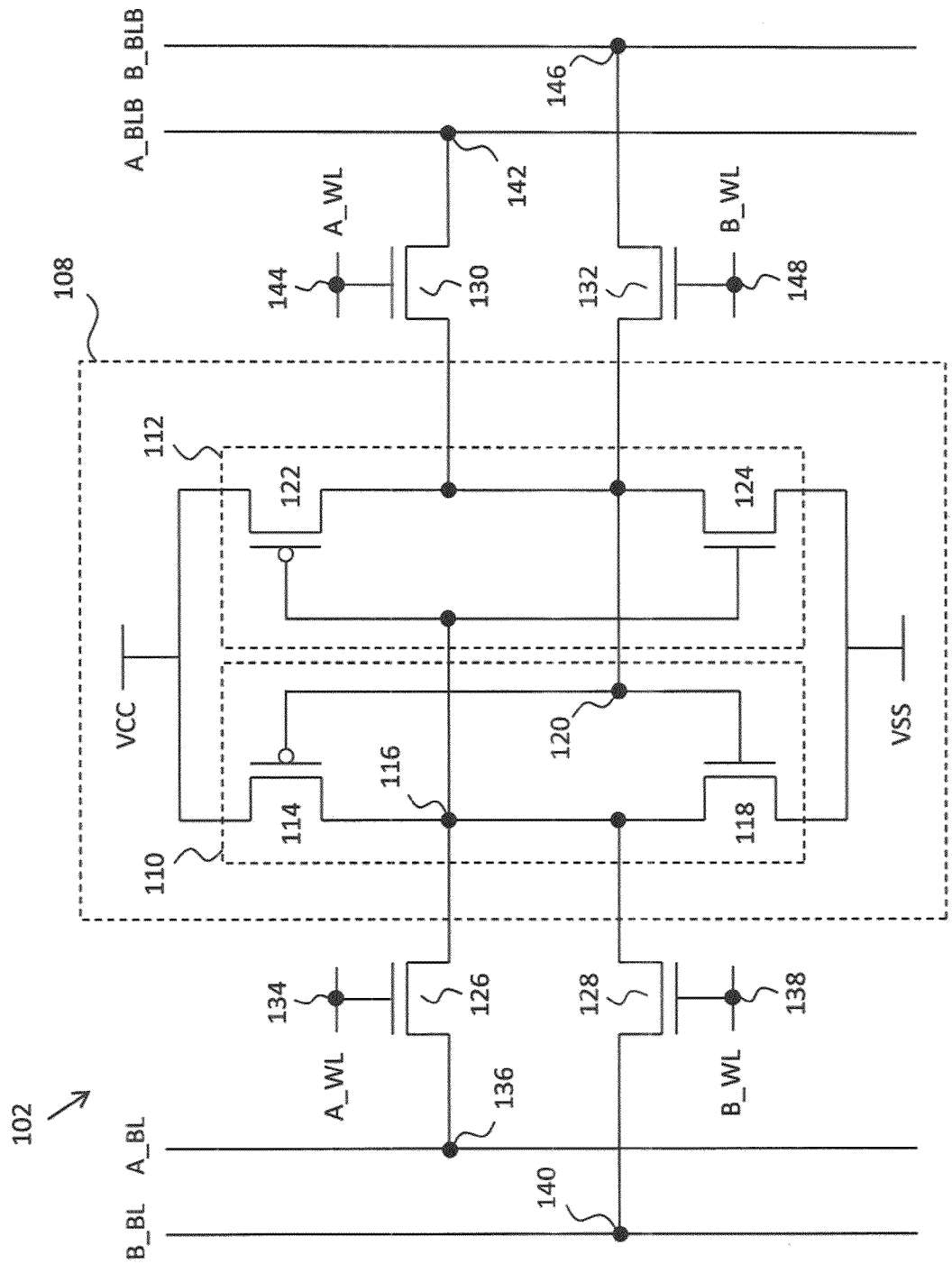
FIG. 2 illustrates one example of an eight transistor memory bit cell that may be implemented in the semiconductor memory of FIG. 1.

As best seen in FIG. 2, which is one example of an eight transistor ("8T") bit cell, each bit cell includes a latch 108 formed by a pair of cross coupled inverters 110, 112. Although an 8T bit cell is illustrated, one skilled in the art will understand that bit cell 102 may include other numbers of transistors including, but not limited to, 6T, 10T, 12T, and 14T, to name a few possibilities. Inverter 110 includes a PMOS transistor 114 having its source coupled to high-voltage source, VCC, and its drain coupled to node 116, which serves as the output of inverter 110. NMOS transistor 118 of inverter 110 has its source coupled to low-voltage source VSS and its drain coupled to node 116. The gates of transistors 114 and 118 are coupled together at node 120, which serves as the input of inverter 110 and the output of inverter 112. Inverter 112 includes a PMOS transistor 122 having is source coupled to VCC, its gate coupled to node 116, and its drain coupled to node 120. NMOS transistor 124 of inverter 112 has its source coupled to VSS, its drain coupled to node 120, and its gate coupled to node 116.

Bit cell 102 also includes a plurality of pass transistors 126, 128, 130, and 132. In some embodiments, transistors 126, 128, 130, and 132 are NMOS transistors, although one skilled in the art will understand that transistors 126, 128, 130, and 132 may be implemented as PMOS transistors. Transistor 126 has its gate coupled to word line A_WL at node 134, its source coupled to node 116, and its drain coupled to bit line A_BL at node 136. Transistor 128 has its gate coupled to word line B_WL at node 138, its source coupled to node 116, and its drain coupled to bit line B_BL at node 140. Transistor 130 has its source coupled to node 120, its drain coupled to bit line A_BLB at node 142, and its gate coupled to word line A_WL at node 144. Transistor 132 has its source coupled node 120, its drain coupled to bit line B_BLB at node 146, and its gate coupled to word line B_WL at node 148.

Figure 3:
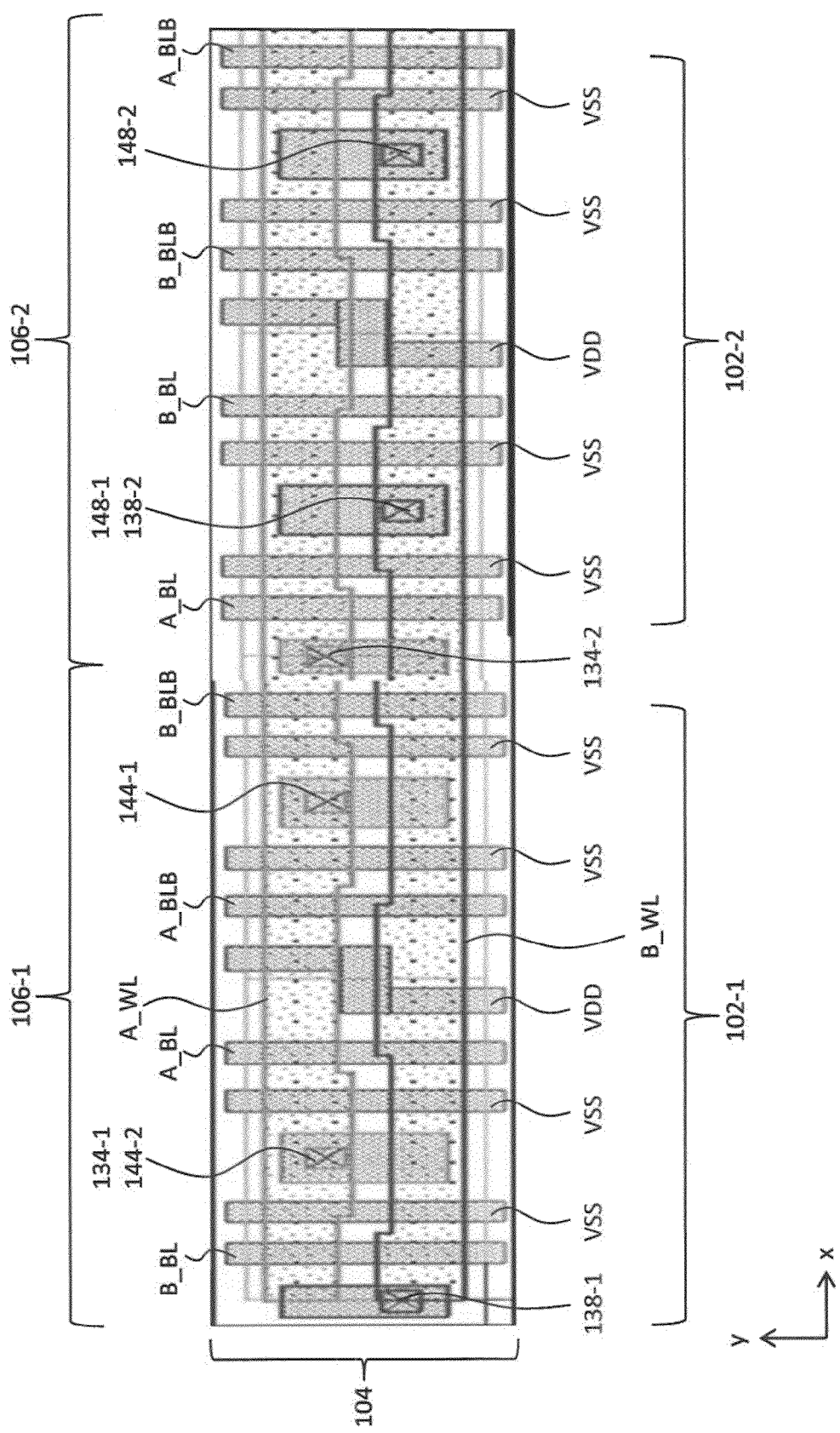
FIG. 3 illustrates one example layout of a pair of bit cells having different configurations to provide balanced resistive and capacitive loading on the word lines to which the bit cells are coupled.

FIG. 3 is an example of a layout view of one row 104 and two columns 106-1, 106-2 of the interconnect structure for a semiconductor memory array. As will be understood by one skilled in the art, FIG. 3 only illustrates two metal layers, e.g., Metal1 ("M1") and Metal2 ("M2"), and one via layer, e.g., VIA1, that connects M1 and M2. FIG. 3 does not illustrate the underlying devices of bit cells 102-1 and 102-1,—which may be SRAM bit cells, dynamic random access memory ("DRAM") bit cells, or read only memory ("ROM") bit cells—in order to simplify the figure. The conductive materials in M1 extend vertically, i.e., in the y-direction, and the conductive materials in M2 extend horizontally, i.e., in the x-direction.

As shown in FIG. 3, bit cell 102-1 includes node 138-1, which connects the gate of pass transistor 128-1 to word line B_WL. Node 131-1 is coupled to word line B_WL by a via formed in layer VIA1. VSS conductor lines shield bit line B_BL from bit line A_BL. Node 134-1 connects pass gate transistor 126-1 to word line A_WL by a via disposed between the parallel VSS conductor lines, which may be connected to one or more of pull-down transistors 118-1 and 124-1 by vias that are not shown in FIG. 3. The via that connects node 134-1 to word line A_WL also connects node 144-2, which is coupled to transistor 130-2, to word line A_WL. Bit lines A_BL and A_BLB are separated from one another by voltage supply line VDD. The vias that couple pull-up transistors 114-1 and 122-1 to voltage supply line VDD are not shown in FIG. 3.

Bit lines A_BLB and B_BLB are shielded from one another by voltage supply lines for VSS. As will be understood by one skilled in the art, the sources of one or more pull-down transistors 118-1 and 124-1 may be coupled to VSS by a via that is not shown in FIG. 3. The gate of pass transistor 130-1 is coupled to word line A_WL at node 144-1, which is formed by a via in layer VIA1. The boundary between bit cells 102-1 and 102-2 is between bit lines B_BLB of column 106-1 and bit line A_BL of column 106-2.

Bit cell 102-2 has a different layout than the layout of bit cell 102-1. For example, the left-most side of bit cell 102-2 (and the right-most side of bit cell 102-1) includes a via for nodes 148-1 and 134-2 at which the respective gates of transistor 132-1 and transistor 128-2 are coupled to word line B_WL. The via for nodes 148-1 and 134-2 is disposed between bit lines B_BLB of column 106-1 and A_BL of column 106-2. A power supply line for VSS extends parallel to bit line A_BL and shields bit line B_BL from bit line A_BL, which extends adjacent to another power supply line for VSS. Vias for connecting one or more of pull-down transistors 118-2 and 124-2 to VSS are not shown in FIG. 3.

Node 138-2, which couples the gate of transistor 128-2 to bit line B_BL, is disposed between the power supply lines for VSS that shield bit lines A_BL and B_BL. The via that couples node 138-2 to word line B_WL also serves as node 148-1 to connect transistor 132-1 to word line B_WL. Bit line B_BL is shielded from bit line B_BLB by a power supply line for VDD. The vias that couple the gates of pull-up transistors 110-2 and 112-2 to word line A_WL are not shown in FIG. 3. Bit line B_BLB of column 106-2 is shielded from bit line A_BLB by a pair of parallel power supply lines for VSS that are disposed between bit lines B_BLB and A_BLB. The via for node 148-2, which couples the gate of transistor 132-2 to word line B_WL, is disposed between the pair of parallel supply lines for VSS. The vias that couple the gates of pull-down transistors 118-2 and 124-2 to word line A_WL are not shown in FIG. 3.

In this embodiment, word lines A_WL and B_WL of row 104 have approximately equal load. For example, the bit cell 102-1 includes three vias coupled to word line A_WL and one via coupled to word line B_WL, and bit cell 102-1 includes one via coupled to word line A_WL and three vias coupled to word line B_WL. Accordingly, word line A_WL and word line B_WL of row 104 are each coupled to four vias and approximately equal capacitive and resistive loading. As will be understood by one skilled in the art, an approximately equal load includes loads that differ by five percent.

Figure 4A:
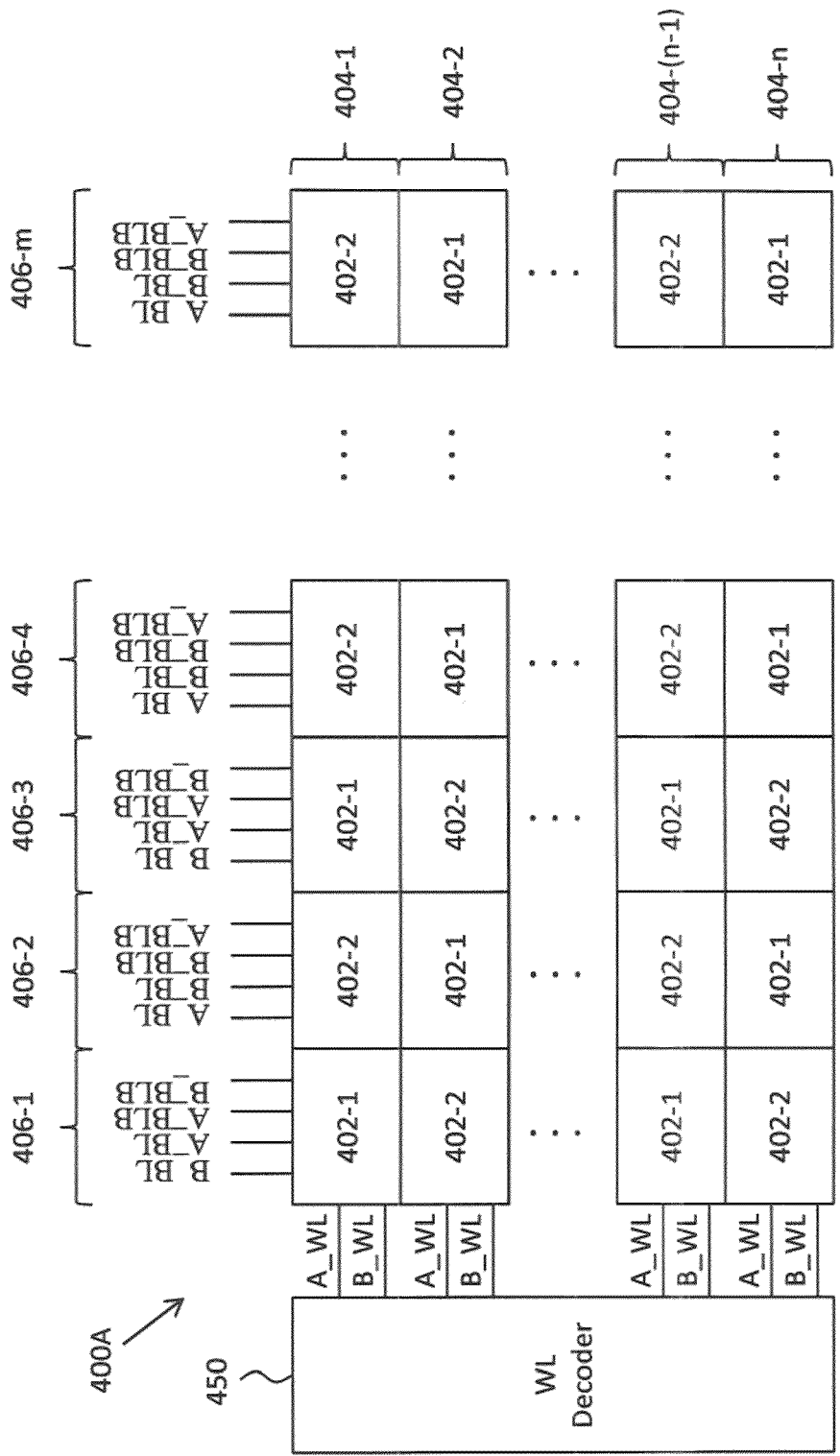
FIGS. 4A and 4B illustrate different embodiments of semiconductor memories including at least two different bit cell layouts.

The manner in which the load on a pair of word lines in a particular row is equalized may be varied. For example, FIG. 4A illustrates one example of a semiconductor memory array 400A including a word line decoder 450 coupled to a respective pair of word lines, A_WL and B_WL, for each of the n rows 404 of bit cells 402. Each of the n rows includes m bit cells 402 arranged in n columns 406 with each column 406 including four bit lines, e.g., A_BL, B_BL, A_BLB, and B_BLB. Bit cells 402-1 may include a greater number of vias coupled to word line A_WL than bit cells 402-2. For example, bit cells 402-1 may include three vias coupled to word line A_WL and one via coupled to word line B_WL, e.g., bit cell 102-1 in FIG. 3. Meanwhile, bit cells 402-2 may include one via coupled to word line A_WL and one via coupled to word line B_WL, e.g., bit cell 102-2 in FIG. 3. However, one skilled in the art will understand that, in other embodiments, the bit cell 402-1 may have fewer vias coupled to word line A_WL than does bit cell 402-2. The alternating of bit cells 402-1 and 402-2 advantageously provide word lines A_WL and B_WL to have approximately equal capacitive loadings, which enables the semiconductor memory array to operate faster.

Figure 4B:
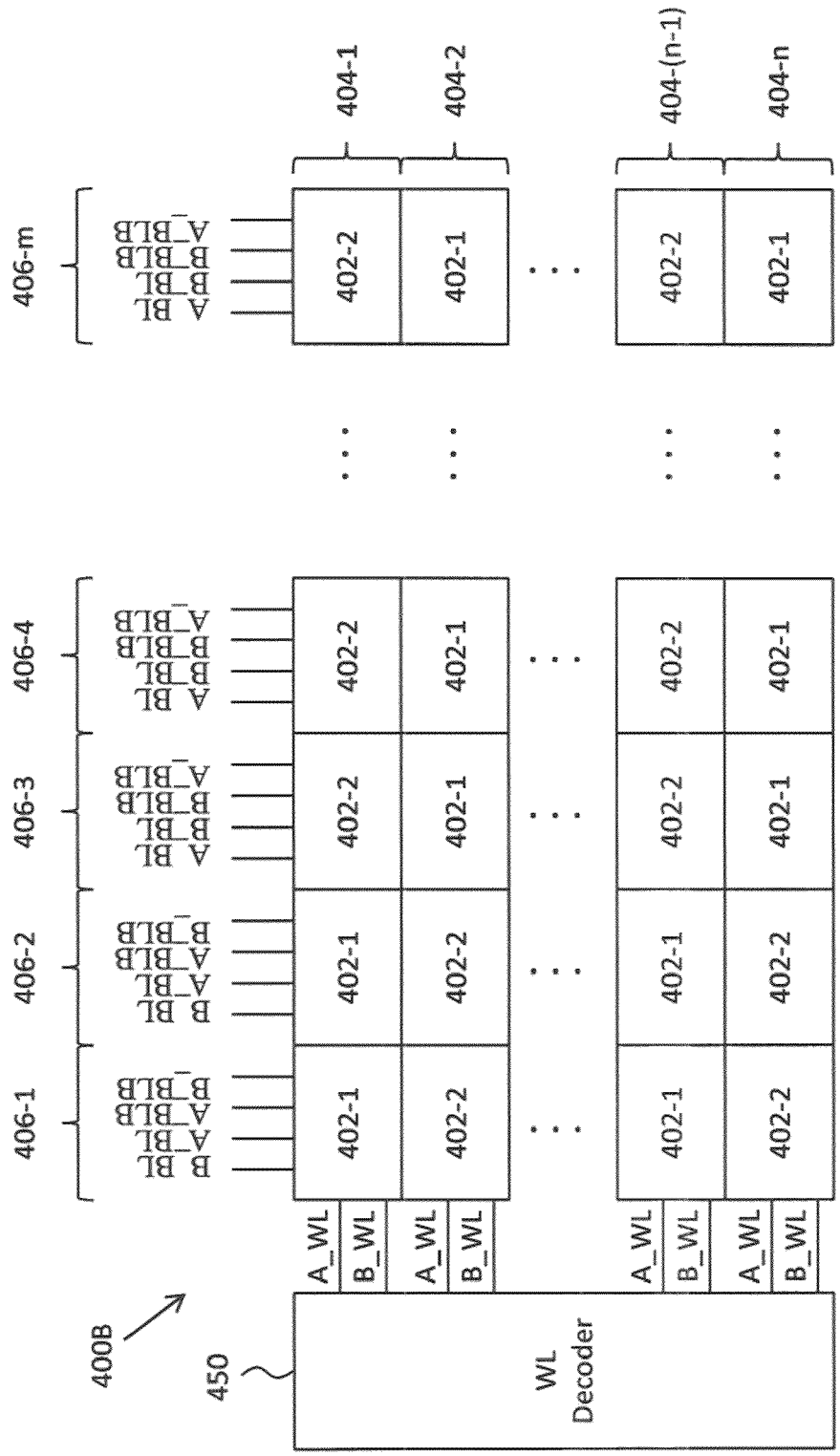

In some embodiments, the bit cells are arranged in a row to provide approximately equal resistive and capacitive ("RC") loading, but are not arranged in an alternating manner. For example, FIG. 4B illustrates another embodiment of a semiconductor memory array 400B in which a pair of bit cells 402-1 bit cells are arranged, such that pairs of bit cells 402-1 and 402-2 are arranged in an alternating manner. As shown in FIG. 4B, row 404-1 includes a bit cell 402-1 in columns 406-1 and 406-2 and bit cells 402-2 in columns 406-3 and 406-4. Conversely, row 404-2 includes a bit cell 402-2 in columns 406-1 and 406-2 and a bit cell 402-1 in columns 406-3 and 406-3. One skilled in the art will understand that two or more bit cell types may be arranged randomly or in patterns to provide word lines having approximately equal resistive and capacitive loading.

In some embodiments, a semiconductor memory includes first and second word lines. A first bit cell of a first type is coupled to a first one of a plurality of bit lines and has a first layout in which the first bit cell of the first type is coupled to the first word line with a first number of vias and to the second word line with a second number of vias. A first bit cell of a second type is coupled to a second one of the plurality of bit lines and has a second layout in which the first bit cell of the second type is coupled to the first word line with a third number of vias and to the second word line with a fourth number of vias. A load on the first word line is approximately equal to a load on the second word line.

In some embodiments, a semiconductor memory includes a plurality of bit lines extending in a first direction, a word line driver circuit, and first and second word lines. The first word line extends in a second direction and is coupled to the word line driver circuit. The second word line extends in the second direction and is coupled to the word line driver circuit. A first bit cell of a first type is coupled to a first one of the plurality of bit lines and has a first layout in which the first bit cell of the first type is coupled to the first word line with a first number of vias and to the second word line with a second number of vias. A first bit cell of a second type is coupled to a second one of the plurality of bit lines and has a second layout in which the first bit cell of the second type is coupled to the first word line with a third number of vias and to the second word line with a fourth number of vias. A load on the word line driver circuit from the first word line is approximately equal to a load on the second word line circuit from the second word line.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
a plurality of bit lines extending in a first direction;
a first word line extending in a second direction;
a second word line extending in the second direction;
a first bit cell of a first type coupled to a first one of the plurality of bit lines and having a first layout in which the first bit cell of the first type is coupled to the first word line with a first number of vias and to the second word line with a second number of vias; and
a first bit cell of a second type coupled to a second one of the plurality of bit lines and having a second layout in which the first bit cell of the second type is coupled to the first word line with a third number of vias and to the second word line with a fourth number of vias,
wherein a load on the first word line is approximately equal to a load on the second word line.

2. The semiconductor memory of claim 1, wherein the first number of vias is greater than the second number of vias and is equal to the fourth number of vias.

3. The semiconductor memory of claim 1, wherein the first number of vias is less than the second number of vias and is equal to the fourth number of vias.

4. The semiconductor memory of claim 1, further comprising:
a third word line extending in the second direction;
a fourth word line extending in the second direction;

a second bit cell of the first type coupled to the second one of the plurality of bit lines, to the third word line with the first number of vias, and to the fourth word line with the second number of vias; and a second bit cell of the second type coupled to the first one of the plurality of bit lines, to the third word line with the third number of vias, and to the fourth word line with the fourth number of vias, wherein a load on the third word line is approximately equal to a load on the fourth word line.

5. The semiconductor memory of claim 4, wherein the first number of vias is greater than the second number of vias and is equal to the fourth number of vias.

6. The semiconductor memory of claim 4, wherein the first number of vias is less than the second number of vias and is equal to the fourth number of vias.

7. The semiconductor memory of claim 1, further comprising:
a third word line extending in the second direction;
a fourth word line extending in the second direction;
a second bit cell of the first type coupled to the first one of the plurality of bit lines, to the third word line with the first number of vias, and to the fourth word line with the second number of vias; and
a second bit cell of the second type coupled to the second one of the plurality of bit lines, to the third word line with the third number of vias, and to the fourth word line with the fourth number of vias,
wherein a load on the third word line is approximately equal to a load on the fourth word line.

8. The semiconductor memory of claim 7, further comprising:
a fifth word line extending in the second direction;
a sixth word line extending in the second direction;
a third bit cell of the first type coupled to the second one of the plurality of bit lines, to the fifth word line with the first number of vias, and to the sixth word line with the second number of vias; and
a third bit cell of the second type coupled to the first one of the plurality of bit lines, to the fifth word line with the third number of vias, and to the sixth word line with the fourth number of vias,
wherein a load on the fifth word line is approximately equal to a load on the sixth word line.

9. The semiconductor memory of claim 1, further comprising:
a second bit cell of the first type coupled to a third one of the plurality of bit lines, to the first word line with the first number of vias, and to the second word line with the second number of vias; and
a second bit cell of the second type coupled to a fourth one of the plurality of bit lines, to the first word line with the third number of vias, and to the second word line with the fourth number of vias.

10. The semiconductor memory of claim 1, wherein the load includes capacitive load.

11. A semiconductor memory, comprising:
a plurality of bit lines extending in a first direction;
a word line driver circuit;
a first word line extending in a second direction and coupled to the word line driver circuit;
a second word line extending in the second direction and coupled to the word line driver circuit;
a first bit cell of a first type coupled to a first one of the plurality of bit lines and having a first layout in which the first bit cell of the first type is coupled to the first word line with a first number of vias and to the second word line with a second number of vias; and
a first bit cell of a second type coupled to a second one of the plurality of bit lines and having a second layout in which the first bit cell of the second type is coupled to the first word line with a third number of vias and to the second word line with a fourth number of vias,
wherein a load on the word line driver circuit from the first word line is approximately equal to a load on the second word line circuit from the second word line.

12. The semiconductor memory of claim 11, wherein the first number of vias is greater than the second number of vias and is equal to the fourth number of vias.

13. The semiconductor memory of claim 11, wherein the first number of vias is less than the second number of vias and is equal to the fourth number of vias.

14. The semiconductor memory of claim 11, further comprising:
a third word line extending in the second direction and coupled to the word line driver circuit;
a fourth word line extending in the second direction and coupled to the word line driver circuit;
a second bit cell of the first type coupled to the second one of the plurality of bit lines, to the third word line with the first number of vias, and to the fourth word line with the second number of vias; and
a second bit cell of the second type coupled to the first one of the plurality of bit lines, to the third word line with the third number of vias, and to the fourth word line with the fourth number of vias,
wherein a load on the word line driver circuit from the third word line is approximately equal to a load on the word line driver circuit from the fourth word line.

15. The semiconductor memory of claim 14, wherein the first number of vias is greater than the second number of vias and is equal to the fourth number of vias.

16. The semiconductor memory of claim 14, wherein the first number of vias is less than the second number of vias and is equal to the fourth number of vias.

17. The semiconductor memory of claim 11, further comprising:
a third word line extending in the second direction and coupled to the word line driver circuit;
a fourth word line extending in the second direction and coupled to the word line driver circuit;
a second bit cell of the first type coupled to the first one of the plurality of bit lines, to the third word line with the first number of vias, and to the fourth word line with the second number of vias; and
a second bit cell of the second type coupled to the second one of the plurality of bit lines, to the third word line with the third number of vias, and to the fourth word line with the fourth number of vias,
wherein a load on the word line driver circuit from the third word line is approximately equal to a load on the word line driver circuit from the fourth word line.

18. The semiconductor memory of claim 17, further comprising:
a fifth word line extending in the second direction and coupled to the word line driver circuit;
a sixth word line extending in the second direction and coupled to the word line driver circuit;
a third bit cell of the first type coupled to the second one of the plurality of bit lines, to the fifth word line with the first number of vias, and to the sixth word line with the second number of vias; and a third bit cell of the second type coupled to the first one of the plurality of bit lines, to the fifth word line with the third number of vias, and to the sixth word line with the fourth number of vias, wherein a load on the word line driver circuit from the fifth word line is approximately equal to a load on the word line driver circuit from the sixth word line.

19. The semiconductor memory of claim 11, further comprising:

a second bit cell of the first type coupled to a third one of the plurality of bit lines, to the first word line with the first number of vias, and to the second word line with the second number of vias; and a second bit cell of the second type coupled to a fourth one of the plurality of bit lines, to the first word line with the third number of vias, and to the second word line with the fourth number of vias.

20. The semiconductor memory of claim 11, wherein the load includes capacitive load.

* * * * *